(12) United States Patent
Shih et al.

(10) Patent No.: US 8,018,768 B2
(45) Date of Patent: Sep. 13, 2011

(54) NON-VOLATILE STATIC RANDOM ACCESS MEMORY (NVSRAM) DEVICE

(75) Inventors: Ping-Chia Shih, Hsin-Chu (TW); Chung-Chin Shih, Hsin-Chu (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 204 days.

(21) Appl. No.: 12/542,711

(22) Filed: Aug. 18, 2009

(65) Prior Publication Data
US 2011/0044109 A1   Feb. 24, 2011

(51) Int. Cl.
*G11C 11/34* (2006.01)
*G11C 16/04* (2006.01)

(52) U.S. Cl. .................. 365/185.07; 365/185.08

(58) Field of Classification Search .......... 365/185.07, 365/185.08, 154, 230.05
See application file for complete search history.

(56) References Cited

U.S. PATENT DOCUMENTS

| 5,272,368 | A  |   | 12/1993 | Turner |
| 5,602,776 | A  | * | 2/1997  | Herdt et al. ............. 365/185.08 |
| 5,914,895 | A  | * | 6/1999  | Jenne ....................... 365/185.08 |
| 6,097,618 | A  |   | 8/2000  | Jenne |
| 6,285,586 | B1 |   | 9/2001  | Lung |
| 6,469,930 | B1 | * | 10/2002 | Murray ..................... 365/185.08 |
| 7,020,007 | B2 | * | 3/2006  | Kwon ........................... 365/154 |
| 7,505,303 | B2 |   | 3/2009  | Ashokkumar |

* cited by examiner

*Primary Examiner* — Anh Phung
(74) *Attorney, Agent, or Firm* — Winston Hsu; Scott Margo

(57) ABSTRACT

A non-volatile static random access memory (NVSRAM) device includes a volatile circuit and a non-volatile circuit. Under normal operations when an external power is supplied, the volatile circuit can provide fast data access. When the power supply is somehow interrupted, the non-volatile circuit can provide data backup using an inverter circuit and a non-volatile erasable programmable memory (NVEPM) circuit, thereby retaining data previously stored in the volatile circuit.

14 Claims, 2 Drawing Sheets

NON-VOLATILE STATIC RANDOM ACCESS MEMORY (NVSRAM) DEVICE

BACKGROUND OF THE INVENTION

1. Field of the Invention

The present invention is related to a non-volatile static random access memory (NVSRAM) device, and more particularly, to an NVSRAM device using an inverter circuit and a non-volatile erasable programmable memory (NVEPM) circuit for providing data backup.

2. Description of the Prior Art

There are essentially two types of data memory devices used in computers today, "non-volatile" and "volatile" memory devices. Common non-volatile memory devices include well-known read only memory (ROM) devices, such as EPROM (erasable programmable ROM) devices, EEPROM (electrically erasable programmable ROM) devices or flash ROM devices. The name "non-volatile" comes from the fact that these non-volatile memory devices maintain the data stored therein, even when power to the device is removed or temporally lost. Volatile memory devices include dynamic random access memory (DRAM) and static random access memory (SRAM) devices. RAM devices have been widely used for temporary data storage, such as during data manipulation, since writing data into or reading data out of these devices can be performed quickly and easily. However, a disadvantage of these volatile devices is that they require the constant application of power, such as in the form of a data refresh signal, to refresh and maintain data stored in the memory cells of the chip. Once power supplied to the device is interrupted, the data stored in the memory cells of the chip is lost.

When used in a computer system, non-volatile memory devices suffer from endurance problem caused by repeated cycling program/erase operations, as well as slow the speed of the computer system due to longer programming time. On the other hand, SRAM with fast data access speed and long lifetime is suitable for use in the computer system, such as in BIOS. However, since SRAM is a volatile memory device, the stored data stored will be lost if power is interrupted. Therefore, computer system designers have recognized the need to back up information stored in non-volatile memories in the event of power failure.

SUMMARY OF THE INVENTION

The present invention provides a non-volatile static random access memory device including a plurality of unit memory cells arranged in an array. Each of the plurality of unit memory cells comprises a volatile circuit for retaining a bit data at a data true node and a data complement node when an external power is applied, and a non-volatile circuit for retaining the bit data after the power has been removed from the volatile circuit. The non-volatile circuit comprises an inverter circuit having an input end coupled to the data complement node and an output end coupled to the data true node, and a non-volatile erasable programmable memory circuit which includes a programmable transistor for storing data from the data complement node in response to an interruption of power supplied to the volatile circuit; a store transistor for selectively coupling the programmable transistor to the data complement node in response to a change in state of power supplied to the volatile circuit; and a recall transistor for selectively coupling the programmable transistor to a first power supply so as to recall the data stored in the storage transistor in response to supply of power to the volatile circuit.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a non-volatile static random access memory (NVSRAM) device having both advantages of the volatile and the non-volatile memory device. The NVSRAM device of the present invention, normally operating in a volatile mode when an external power is supplied, can provide fast data access and without endurance problem. After the power is turned off and before the power is turned back on, such as during a blackout or brownout, the NVSRAM device operates in a non-volatile mode to write in and read out, so that the data previous stored can be preserved.

The NVSRAM device according to the present invention includes a memory cell array, a plurality of bit lines, and a plurality of word lines. The memory cell array includes multiple columns of NVSRAM cells in the vertical direction and multiple rows of NVSRAM cells in the horizontal direction. The bit lines extend to all overlapping NVSRAM cells in a direction parallel to the vertical columns of the memory cell array, while the word lines extend to all overlapping NVSRAM cells in a direction parallel to the horizontal rows of the memory cell array. In the memory array, each NVSRAM cell has identical structure, each vertical column of the NVSRAM cells shares a corresponding pair of bit lines BT and BC, and each horizontal row of the NVSRAM cells shares a corresponding word line WL.

Figure 1:
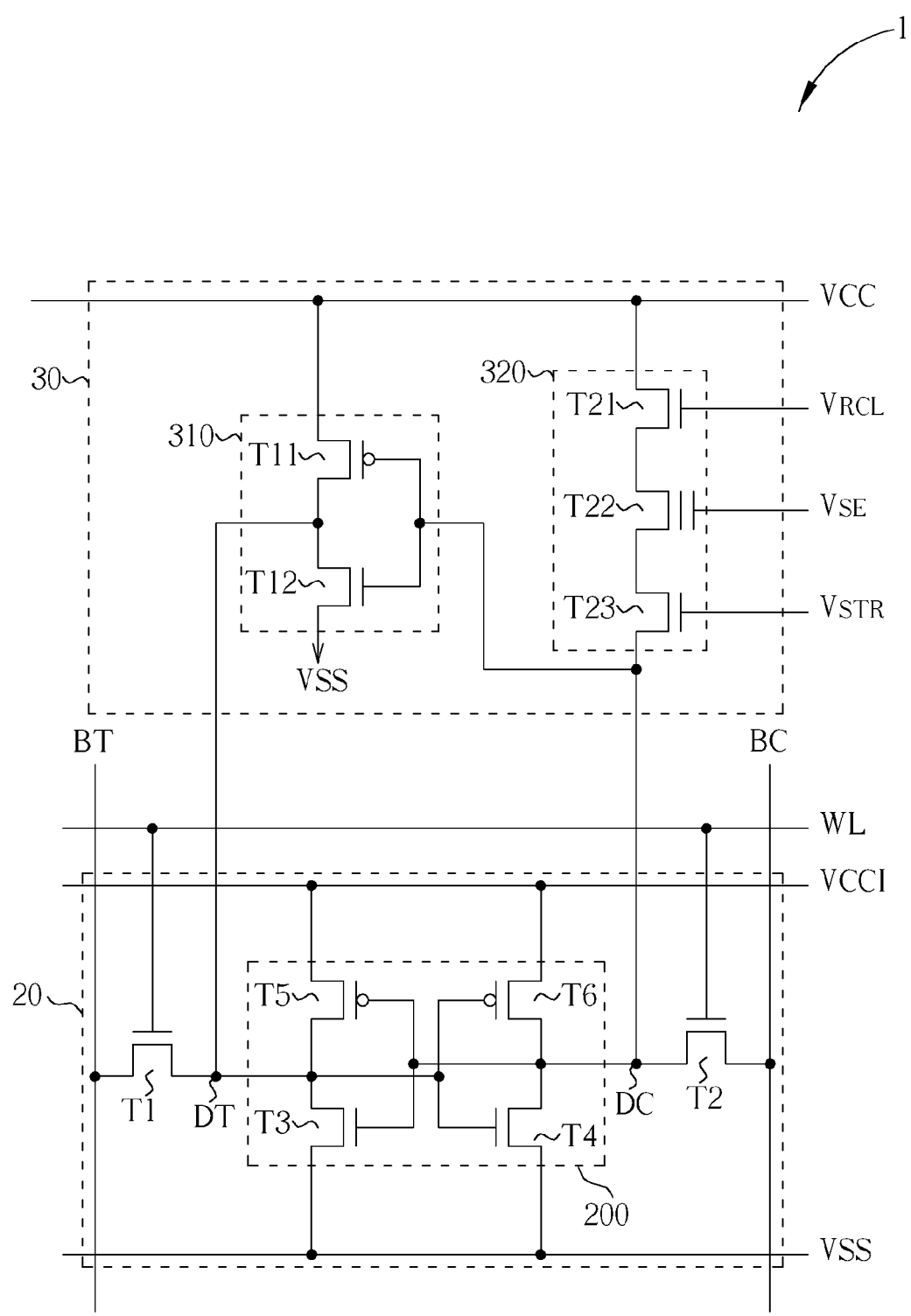
FIG. 1 is a schematic equivalent circuit diagram illustrating an NVSRAM cell according to a first embodiment of the present invention.
Figure 2:
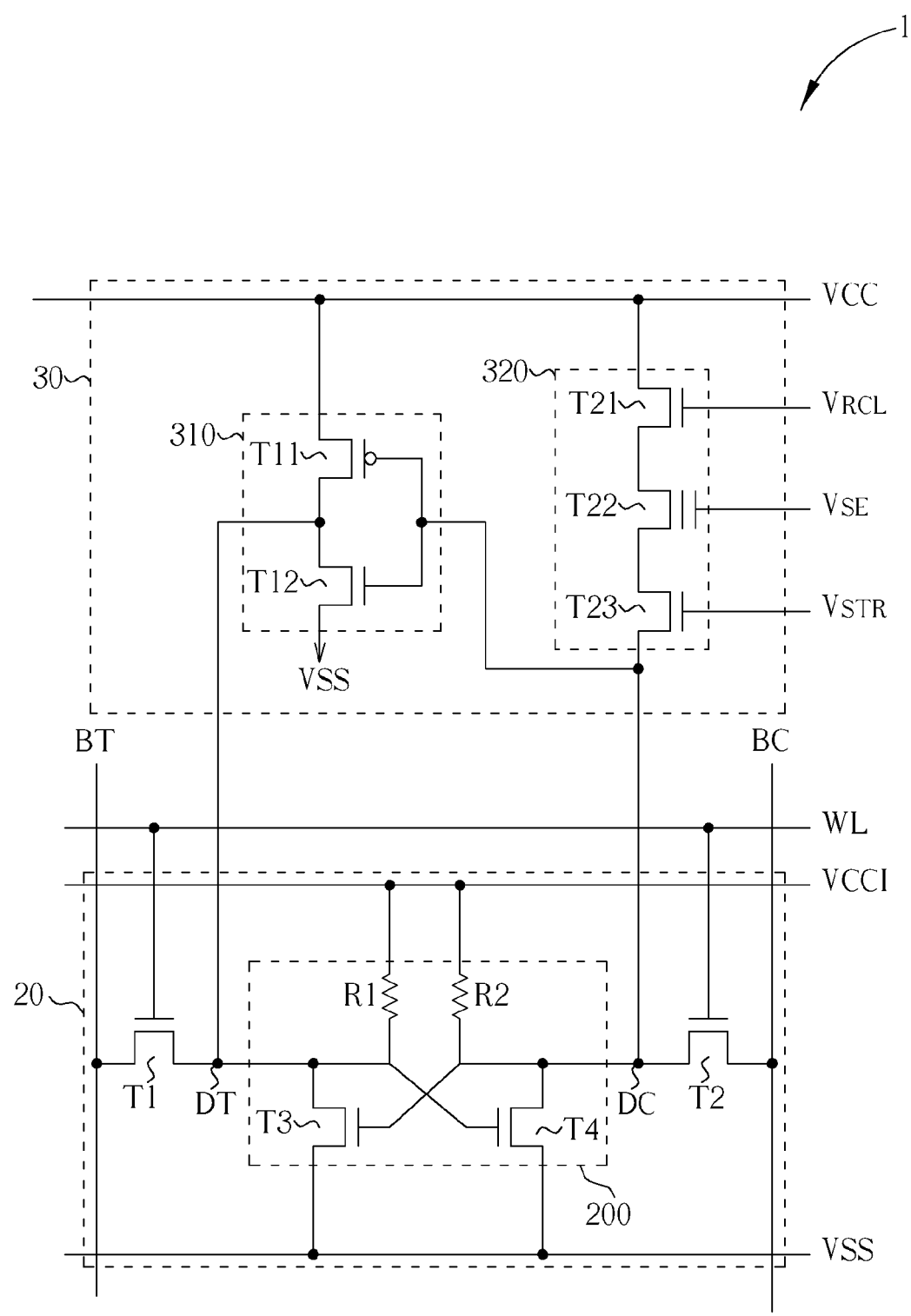
FIG. 2 is a schematic equivalent circuit diagram illustrating an NVSRAM cell according to a second embodiment of the present invention.

FIGS. 1 and 2 are schematic equivalent circuit diagrams of an NVSRAM cell 10 in the memory cell array according to the embodiments of the present invention. The NVSRAM cell 10 includes a volatile circuit 20 and a non-volatile circuit 30. The volatile circuit 20 of the NVSRAM cell 10 can retain its contents as long as power remains applied. The non-volatile circuit 30 of the NVSRAM cell 10 can provide backup storage to the volatile circuit 20 in the event when power is removed from the NVSRAM cell 10.

The volatile circuit 20 includes a storage unit 200 and two access transistors T1 and T2. The storage unit 200 can be electrically connected to the corresponding bit lines BT and BC via the access transistors T1 and T2, respectively. When power is supplied, the storage unit 200 of the volatile circuit 20 stores data at a data true (DT) node and a data complement (DC) node. Access to each storage unit 200 is enabled by the word line WL which controls the two access transistors T1 and T2. The access transistors T1 and T2 control whether the storage unit 200 should be connected to the bit lines BT and BC for transferring data onto the bit lines or for receiving data from the bit lines during READ and WRITE operations, which will be explained in detail in the following paragraphs.

In the first embodiment of the present invention as illustrated in FIG. 1, the volatile circuit 20 adopts a 6T structure which denotes the two access transistors T1, T2 and the four transistors T3-T6 in the storage unit 200. The transistors T3 and T5 form a first inverter and the transistors T4 and T6 form a second inverter. The first and second inverters are disposed in parallel between a power supply VCCI and a power supply VSS, wherein the voltage level of the power supply VCCI is higher than that of the power supply VSS. The output end of the first inverter (DT node) is coupled to the input end of the second inverter (the gate terminal of the transistors T4 and T6) and the output end of the second inverter (DC node) is coupled to the input end of the first inverter (the gate terminal of the transistors T3 and T5). These two cross-coupled inverters form a 1-bit latch configuration in which when one of the inverters is in an ON state (logic 1 output) the other is necessarily in an OFF state (logic 0 output). This manner of operation provides two stable states, which are used to denote the value of a bit data. For example, a bit of data of logic 0 can be represented by placing the first inverter in an OFF state and the second inverter in an ON state, while a bit of data of logic 1 can represented by placing the first inverter in an ON state and the second inverter in an OFF state. Accordingly, six transistors store one bit of memory in the first embodiment of the present invention.

In the second embodiment of the present invention as illustrated in FIG. 2, the volatile circuit 20 adopts a 4T structure which denotes the two access transistors T1, T2 and two transistors T3, T4 in the storage unit 200. The gate terminal of the transistor T3 is coupled to the DC node, while the drain terminal of the transistor T3 is coupled to the DT node. The gate terminal of the transistor T4 is coupled to the DT node, while the drain terminal of the transistor T4 is coupled to the DC node. The transistors T3 and T4 form a 1-bit latch configuration in which when one of the transistors is in an ON state (logic 1 output) the other is necessarily in an OFF state (logic 0 output). This manner of operation provides two stable states, which are used to denote the value of a bit data. For example, a bit of data of logic 0 can be represented by placing the transistor T3 in an OFF state and the transistor T4 in an ON state, while a bit of data of logic 1 can represented by placing the transistor T3 in an ON state and the transistor T4 in an OFF state. The storage unit 200 according to the second embodiment of the present invention further includes resistors R1 and R2 for aiding the transistors T3 and T4 in latching a bit data from the non-volatile circuit 30 or from the exterior environment. Accordingly, four transistors store one bit of memory in the second embodiment of the present invention.

In the embodiments illustrated in FIGS. 1 and 2, the transistors T1-T6 can be field effect transistors (FETs), or other devices having similar function. To achieve 1-bit latch configuration in the first embodiment shown FIG. 1, each of the cross-coupled inverters adopt two transistor of opposite doping type. For example, the transistors T3 and T4 can be n-type transistors, while the transistors T5 and T6 can be p-type transistors. The embodiments depicted in FIGS. 1 and 2 are for illustrative purpose, but do not limit the scope of the present invention.

The volatile circuit 20 of the present invention typically has three states: STANDBY, WRITE and READ. In the STANDBY state, the volatile circuit 20 is idle while waiting for a read or a write operation to occur. Since the word line WL is not asserted, the access transistors T1 and T2 disconnect the storage unit 200 from the bit lines BT and BC, respectively. The first cross-coupled inverter formed by the transistors T3, T5 and the second cross-coupled inverter formed by transistors T4, T6 (in FIG. 1), or the transistors T3 and T4 (in FIG. 2), continue to reinforce each other and the data remains unchanged.

In the WRITE state, the contents of the volatile circuit 20 are updated. Assume for purposes of explanation that the DT node is at a logic level 1 and the DC node is at a logic level 0 prior to the WRITE cycle. The WRITE cycle commences by applying the value to be written to the bit lines BT and BC. If a logic 0 is the desired data to be written, then the bit line BT is taken to ground while bit line BC is pre-charged to a high level. Upon asserting the word line WL for turning on the access transistors T1 and T2, the high level DT node gets discharged to ground through the turned-on access transistor T1 and the storage unit 200 flips its state, thus writing a logic 0 into the volatile circuit 20. Similarly, if a logic 1 is the desired data to be written, then the bit line BT is pre-charged to a high level while bit line BC is taken to ground. Upon asserting the word line WL for turning on the access transistors T1 and T2, the DT node remains at high level and the DC node remains at low level, thus writing a logic 1 into the volatile circuit 20.

In the READ state, data within the volatile circuit 20 is requested. Assume for purposes of explanation that the content of the volatile circuit 20 corresponds to a logic 1 stored at the DT node and a logic 0 stored at the DC node prior to the READ cycle. The READ cycle commences by pre-charging both the bit lines BT and BC to a logical 1, then asserting the word line WL, thereby enabling both the access transistors T1 and T2. The values stored at the DT node and the DC node are transferred to the bit lines BT and BC by leaving the bit line BT at its pre-charged value and discharging the bit line BC through the access transistor T2. On the BT side, the access transistor T1 is cut off because its gate-to-source voltage equals 0V, and the bit line BT thus remains pre-charged at logic 1. If, however, the content of the memory of SRAM cell corresponds to a logic 0 stored at the DT node and a logic 1 stored at the DC node prior to the READ cycle, the opposite would happen in which the bit line BC is pulled towards a logic 1 and the bit line BT is discharged through the transistor T1.

The non-volatile circuit 30 of the NVSRAM cell 10 includes an inverter circuit 310 and a non-volatile erasable programmable memory (NVEPM) circuit 320. The inverter circuit 310 includes two transistors T11 and T12 coupled in series between a power supply VCC and a power supply VSS, wherein the voltage level of the power supply VCC is higher than that of the power supply VSS. The input end of the inverter circuit 310 (the gate terminal of the transistors T11 and T12) is coupled to the DC node, while the output end of the inverter circuit 310 (the drain terminal of the transistors T11 and T12) is coupled to the DT node. When the input end of the inverter circuit 310 is at high voltage level, the transistor T12 is turned on and the transistor T11 is turned off, thereby pulling down the output end of the inverter circuit 310 to the voltage level of the power supply VSS via the transistor T12; when the input end of the inverter circuit 310 is at low voltage level, the transistor T11 is turned on and the transistor T12 is turned off, thereby pulling up the output end of the inverter circuit 310 to the voltage level of the power supply VCC via the transistor T11. In the embodiments illustrated in FIGS. 1 and 2, the transistor T11 can be a p-type FET and the transistor T12 can be an n-type FET, or other devices having similar function. The embodiments depicted in FIGS. 1 and 2 are for illustrative purpose, but do not limit the scope of the present invention.

The NVEPM circuit 320 includes a recall transistor T21, a programmable transistor T22 and a store transistor T23, which are coupled in series between the power supply VCC and the DC node. The transistors T21-T23 function equivalently as a tri-gate transistor, in which the recall transistor T21 operates according to a control signal $V_{RCL}$ applied to its gate terminal, the programmable transistor T22 operates according to a control signal $V_{SE}$ applied to its gate terminal, and the storage transistor T23 operates according to a control signal $V_{STR}$ applied to its gate terminal. In the embodiments illustrated in FIGS. 1 and 2, the recall transistor T21 and the store transistor T23 can be n-type FETs, or other devices having similar function. The programmable transistor T22 can be a silicon-oxide-nitride-oxide-semiconductor (SONOS) FET, a bandgap-engineered-silicon-oxide-nitride-oxide-semiconductor (BE-SONOS) FET, a metal-oxide-nitride-oxide-semiconductor (MONOS) FET, a tantalum-alumina-nitride-oxide-semiconductor (TANOS) FET, a double gate (DG) transistor, a ferroelectric random access memory (FRAM), a magneto-resistive random access memory (MRAM), a phase-change memory (PCM), or other devices having similar function. The embodiments depicted in FIGS. 1 and 2 are for illustrative purpose, but do not limit the scope of the present invention.

The non-volatile circuit 30 of the NVSRAM cell 10 typically has two operations: PROGRAM and ERASE. The switching between the PROGRAM and ERASE operations is controlled by the recall transistor T21 and the store transistor T23 operative according to the control signals $V_{RCL}$ and $V_{STR}$ to appropriately configure the non-volatile circuit 30 for the transfer of a bit data between the volatile circuit 20 and the non-volatile circuit 30. More specifically, during the PROGRAM operation, a high level control signal $V_{STR}$ is applied and the turned-on store transistor T23 thus electrically connects the non-volatile circuit 30 to the volatile circuit 20, while a low level control signal $V_{RCL}$ is applied and the recall transistor T21 is thus turned off to disconnect the non-volatile circuit 30 from the power supply VCC. During the ERASE operation, a high level control signal $V_{STR}$ is applied and the turned-on store transistor T23 thus electrically connects the non-volatile circuit 30 to the volatile circuit 20, while a high level control signal $V_{RCL}$ is applied and the recall transistor T21 is thus turned on to electrically connect the non-volatile circuit 30 to the power supply VCC. Otherwise, a low level control signal $V_{STR}$ is applied and the store transistor T23 is thus turned off to disconnect the non-volatile circuit 30 from the volatile circuit 20.

The PROGRAM operation of the non-volatile circuit 30 refers to an operation where data stored in the volatile circuit 20 is quickly moved to and stored in the non-volatile circuit 30 when an external power supply is turned off. Prior to the PROGRAM operation, the non-volatile circuit 30 has been disconnected from the power supply VCC by placing $V_{RCL}$ in a low condition to turn off the recall transistor T21, and disconnected from the volatile circuit 20 by placing $V_{STR}$ in a low condition to turn off the store transistor T23. The PROGRAM operation is initiated by placing the control signal $V_{STR}$ in a high condition, thereby turning on the store transistor T23 and electrically connecting the volatile circuit 20 to the NVEPM circuit 320 of the non-volatile circuit 30. Next, the control signal $V_{SE}$ is cycled from ground to a large negative voltage (referred to as an erase voltage) to place the programmable transistor T22 in a known condition and then to a large positive voltage (referred to as a program voltage) to establish a threshold level which reflects the state of the volatile circuit 20. For example, if the DT node is at logic 1 and the DC node is at logic 0, the source terminal of the programmable transistor T22 is pulled down to a low level potential via the store transistor T23 which has been turned on by the high level control signal $V_{STR}$. In this condition, when the program voltage is applied to the gate terminal of the programmable transistor T22 through the control signal $V_{SE}$, tunneling occurs due to a potential difference established between the gate terminal, the source terminal and a potential well, thereby increasing the threshold voltage of the programmable transistor T22 which reflects the 0 state of the DC node. In the inverter circuit 310, the transistor T11 is turned on and the transistor T12 is turned off, so that the 1 state of DT node is retained by the turned-on transistor T11 of the inverter circuit 310. Similarly, if the DT node is at logic 0 and the DC node is at logic 1, the source terminal of the programmable transistor T22 is kept at a high level via the store transistor T23 which has been turned on by the high level control signal $V_{STR}$. In the inverter circuit 310, the transistor T11 is turned off and the transistor T12 is turned on. In this condition, when the program voltage is applied to the gate terminal of the programmable transistor T22 through the control signal $V_{SE}$, no potential difference between the gate terminal, the source terminal and the potential well is generated. Accordingly, the programmable transistor T22 is not programmed and can reflect the 1 state of the DC node, while the 0 state of the DT node can be retained by the turned-on transistor T12 of the inverter circuit 310.

The ERASE operation of the non-volatile circuit 30 refers to an operation where the data stored in the non-volatile circuit 30 are quickly recalled to the volatile circuit 20 when the external power supply is turned on. The ERASE cycle commences first by discharging the bit lines BT and BC to ground, clamping VCCI to VSS and then by turning on the word line WL. After discharging the DT node and the DC node to ground, the word line WL is then returned to ground. Next, the control signal $V_{STR}$ is placed in a high condition to turn on the store transistor T23, thereby electrically connecting the NVEPM circuit 320 to the volatile circuit 20. The control signal $V_{RCL}$ is placed in a high condition to turn on the recall transistor T21, thereby electrically connecting the NVEPM circuit 320 to the power supply VCC. With the control signal $V_{SE}$ held at ground and assuming the last PROGRAM operation left the programmable transistor T22 unprogrammed, the programmable transistor T22 is now conducting, thereby charging the DC node to high level. Meanwhile, with the gate terminals of the transistors T11 and T12 also charged to high level, the transistor T11 is turned off and the transistor T12 is turned on, thereby discharging the DT node to low level. In other words, the DT node charges up high, while the DC node remains low, thereby reestablishing the data corresponding to the last STORE cycle as explained above.

Under normal operations when an external power is supplied, the volatile circuit 20 in the NVSRAM device of the present invention can provide fast data access. When the power supply is somehow interrupted, the non-volatile circuit 30 can provide data backup. Therefore, the present invention can provides an NVSRAM device having both advantages of the volatile and the non-volatile memory device.

Those skilled in the art will readily observe that numerous modifications and alterations of the device and method may be made while retaining the teachings of the invention.

What is claimed is:

1. A non-volatile static random access memory (NVSRAM) device including a plurality of unit memory cells arranged in an array, wherein each of the plurality of unit memory cells comprises:

a volatile circuit for retaining a bit data at a data true node and a data complement node when an external power is applied; and a non-volatile circuit for retaining the bit data after the power has been removed from the volatile circuit, the non-volatile circuit comprising:
an inverter circuit including:
an input end coupled to the data complement node; and
an output end coupled to the data true node; and
a non-volatile erasable programmable memory (NVEPM) circuit including:
a programmable transistor for storing data from the data complement node in response to an interruption of power supplied to the volatile circuit;
a store transistor for selectively coupling the programmable transistor to the data complement node in response to a change in state of power supplied to the volatile circuit; and
a recall transistor for selectively coupling the programmable transistor to a first power supply so as to recall the data stored in the storage transistor in response to supply of power to the volatile circuit.

2. The NVSRAM device of claim 1 wherein the inverter circuit comprises:
a first transistor including:
a control end coupled to the input end of the inverter circuit;
a first end coupled to the first power supply; and
a second end coupled to the output end of the inverter circuit; and
a second transistor including:
a control end coupled to the input end of the inverter circuit;
a first end coupled to a second power supply which provides a voltage level lower than that of the first power supply; and
a second end coupled to the output end of the inverter circuit.

3. The NVSRAM device of claim 2 wherein the first transistor is a p-type field effect transistor (FET) and the second transistor is an n-type FET.

4. The NVSRAM device of claim 1 wherein:
the store transistor includes:
a control end for receiving a first control signal associated with the change in state of power supplied to the volatile circuit;
a first end coupled to the data complement node; and
a second end;
the programmable transistor includes:
a control end for receiving a second control signal associated with the interruption of the power supplied to the volatile circuit;
a first end coupled to the second end of the store transistor; and
a second end; and
the recall transistor includes:
a control end for receiving a third control signal associated with the supply of power to the volatile circuit;
a first end coupled to the second end of the programmable transistor; and
a second end coupled to the first power supply.

5. The NVSRAM device of claim 4 wherein the storage transistor and the recall transistor are n-type FETs.

6. The NVSRAM device of claim 4 wherein the programmable transistor is a silicon-oxide-nitride-oxide-semiconductor (SONOS) FET, a bandgap-engineered-silicon-oxide-nitride-oxide-semiconductor (BE-SONOS) FET, a metal-oxide-nitride-oxide-semiconductor (MONOS) FET, a tantalum-alumina-nitride-oxide-semiconductor (TANOS) FET, a double gate (DG) transistor, a ferroelectric random access memory (FRAM), a magneto-resistive random access memory (MRAM), or a phase-change memory (PCM).

7. The NVSRAM device of claim 1 wherein the volatile circuit comprises:
a storage unit for latching a state of the bit data; and
a first access transistor for selectively coupling the storage unit to a first bit line according to a voltage level of a word line; and
a second access transistor for selectively coupling the storage unit to a second bit line according to the voltage level of the word line.

8. The NVSRAM device of claim 7 wherein:
the first access transistor includes:
a control end coupled to the word line;
a first end coupled to the data true node; and
a second end coupled to the first bit line; and
the second access transistor includes:
a control end coupled to the word line;
a first end coupled to the data complement node; and
a second end coupled to the second bit line.

9. The NVSRAM device of claim 8 wherein the first and second access transistors are n-type FETs.

10. The NVSRAM device of claim 7 wherein the storage unit comprises:
a first transistor including:
a control end coupled to the data complement node;
a first end coupled to a second power supply which provides a voltage level lower than that of the first power supply; and
a second end coupled to the data true node; and
a second transistor including:
a control end coupled to the data true node;
a first end coupled to the second power supply; and
a second end coupled to the data complement node.

11. The NVSRAM device of claim 10 wherein the first and second transistors are n-type FETs.

12. The NVSRAM device of claim 10 wherein the storage unit further comprises:
a third transistor including:
a control end coupled to the data complement node;
a first end coupled to a third power supply which provides a voltage level higher than that of the second power supply; and
a second end coupled to the data true node; and
a fourth transistor including:
a control end coupled to the data true node;
a first end coupled to the third power supply; and
a second end coupled to the data complement node.

13. The NVSRAM device of claim 12 wherein the first and second transistors are n-type FETs, and the third and fourth transistors are p-type FETs.

14. The NVSRAM device of claim 12 wherein the storage unit further comprises:
a first resistor coupled between the data true node and a third power supply which provides a voltage level higher than that of the second power supply; and
a second resistor coupled between the data complement node and the third power supply.

* * * * *